(12) United States Patent
Sakoh

(10) Patent No.: US 7,974,137 B2
(45) Date of Patent: Jul. 5, 2011

(54) SEMICONDUCTOR MEMORY DEVICE

(75) Inventor: Takashi Sakoh, Tokyo (JP)

(73) Assignee: Renesas Electronics Corporation, Kanagawa (JP)

(*) Notice: Subject to any disclaimer, the term of this patent is extended or adjusted under 35 U.S.C. 154(b) by 132 days.

(21) Appl. No.: 12/411,618

(22) Filed: Mar. 26, 2009

(65) Prior Publication Data

US 2009/0244990 A1    Oct. 1, 2009

(30) Foreign Application Priority Data

Mar. 31, 2008 (JP) ................................ 2008-090160

(51) Int. Cl.
*G11C 7/00* (2006.01)

(52) U.S. Cl. ............................... 365/189.07; 365/210.1

(58) Field of Classification Search ......................... None
See application file for complete search history.

(56) References Cited

U.S. PATENT DOCUMENTS

| 6,556,469 B2 * | 4/2003 | Birk et al. ..................... 365/149 |
| 2005/0099866 A1 * | 5/2005 | Laurent ......................... 365/218 |

FOREIGN PATENT DOCUMENTS

| JP | 6-012860 | 1/1994 |
| JP | 2001-68636 | 3/2001 |
| JP | 2005-228446 | 8/2005 |
| JP | 2006-278778 | 10/2006 |

* cited by examiner

*Primary Examiner* — Hoai V Ho
*Assistant Examiner* — James G Norman
(74) *Attorney, Agent, or Firm* — Young & Thompson

(57) ABSTRACT

A semiconductor memory device comprises a comparing unit that comprises a potential of a memory cell with a reference potential supplied by a reference cell to read data of the memory cell; first and second bit lines connected to inputs of the comparing unit; a first memory cell connected to the first bit line; a second memory cell connected to the second bit line; a first reference cell acting as the reference cell; a second reference cell acting as another reference cell; a potential line that supplies the reference potential to the first and second reference cells; and a dummy cell comprising a coupling capacitor that stabilizes potential of the potential line.

8 Claims, 17 Drawing Sheets

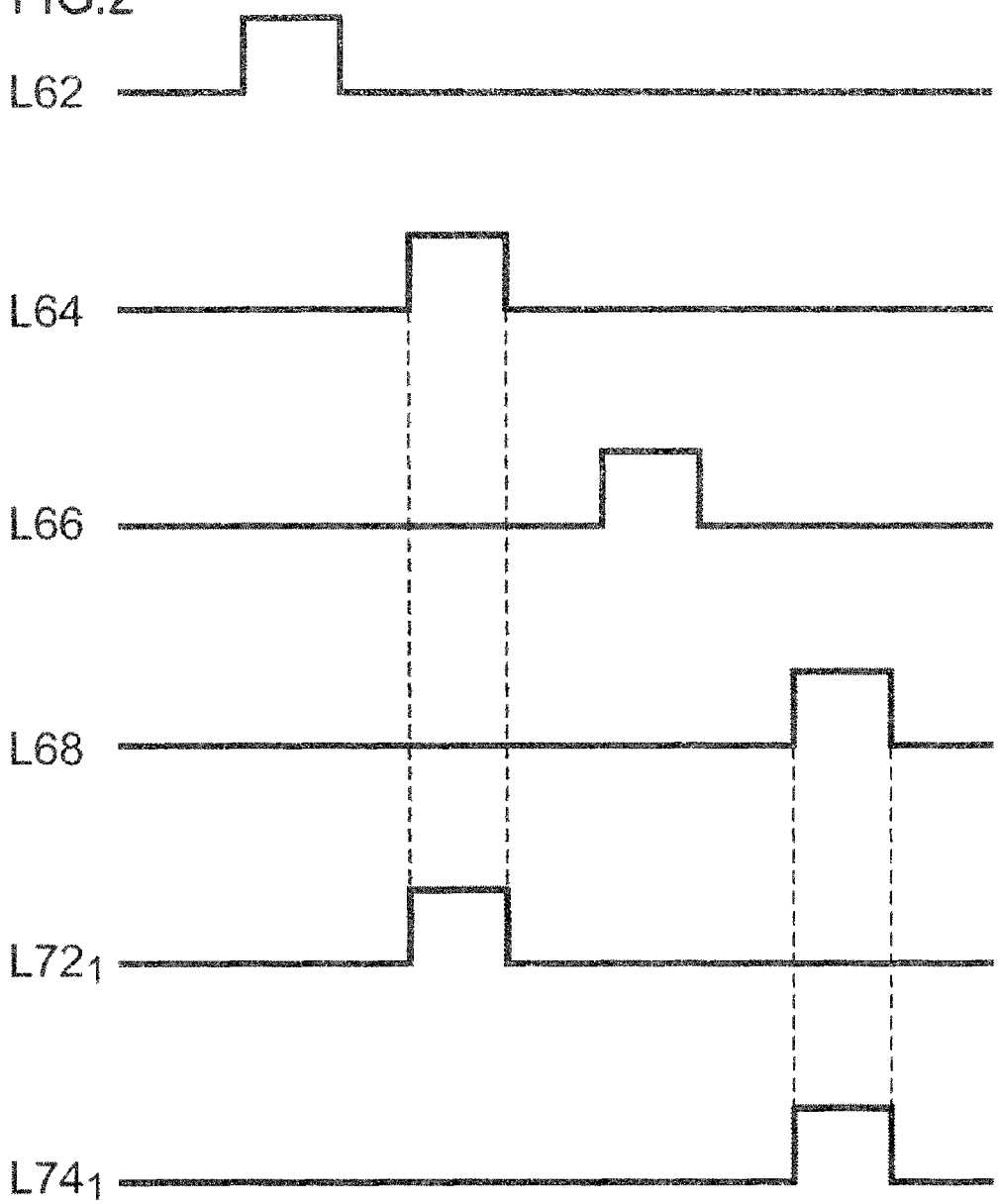

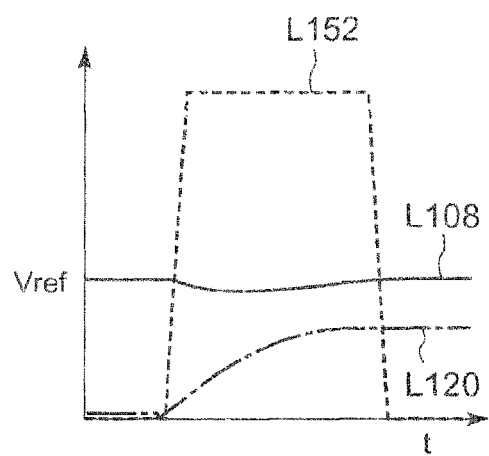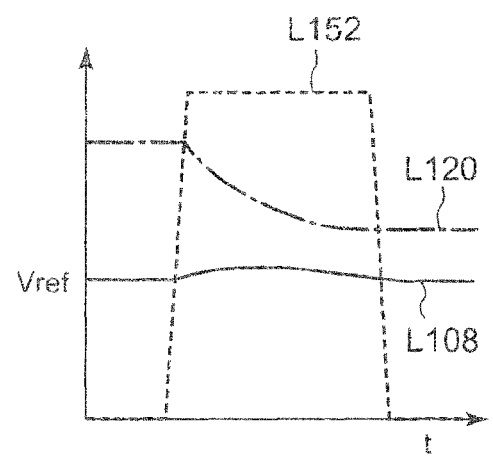

FIG.8 (A-A')

DUMMY CELL REGION | MEMORY CELL AND REFERENCE CELL REGIONS

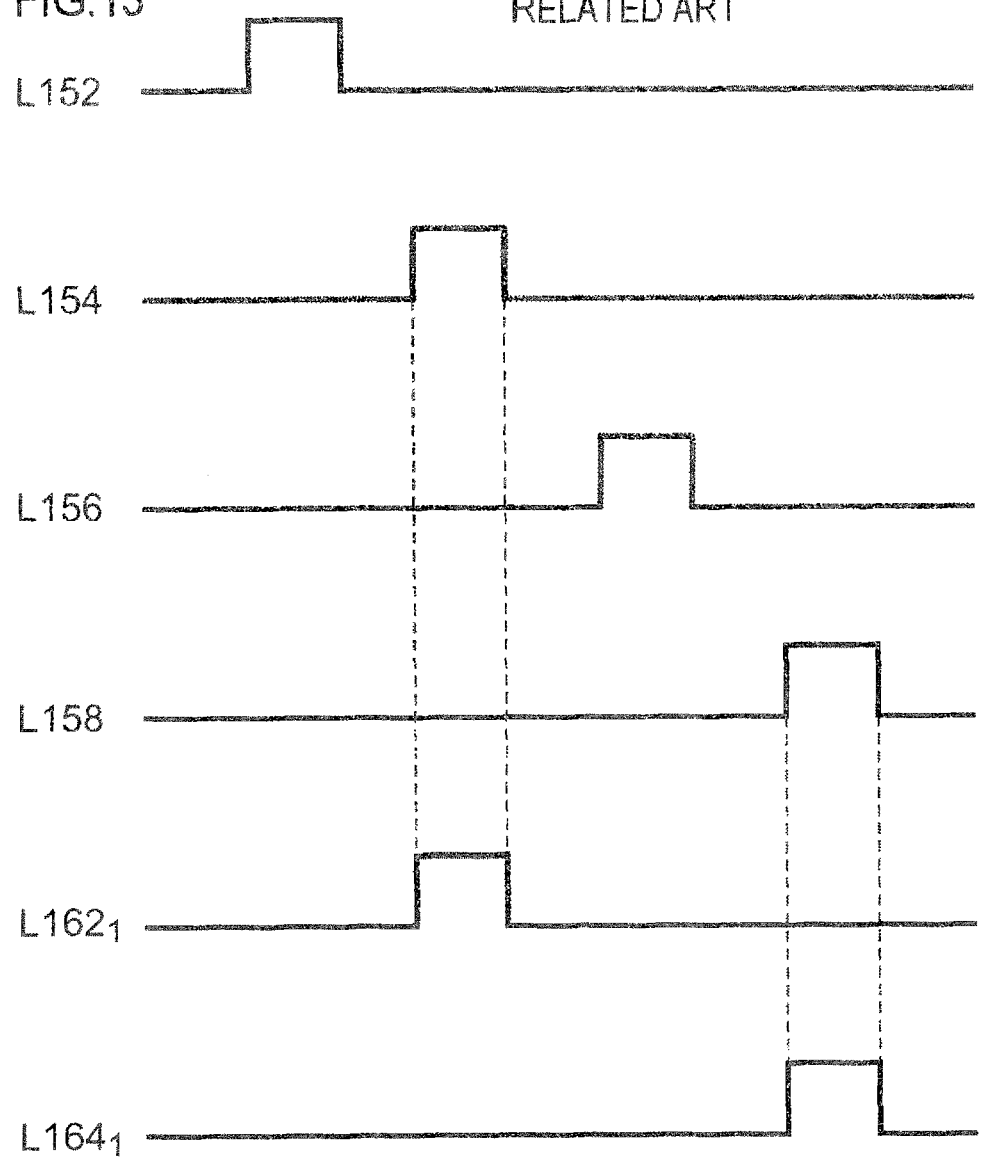

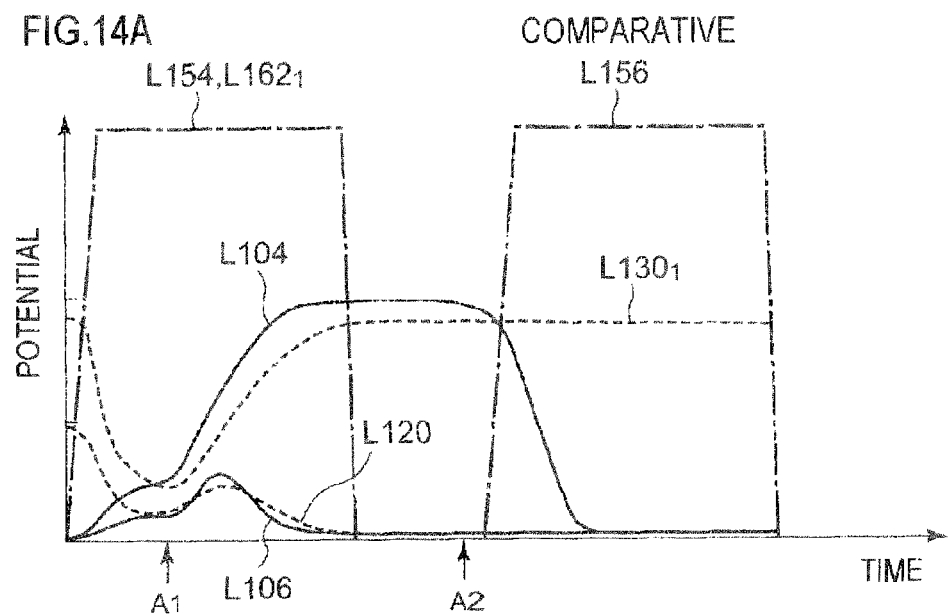
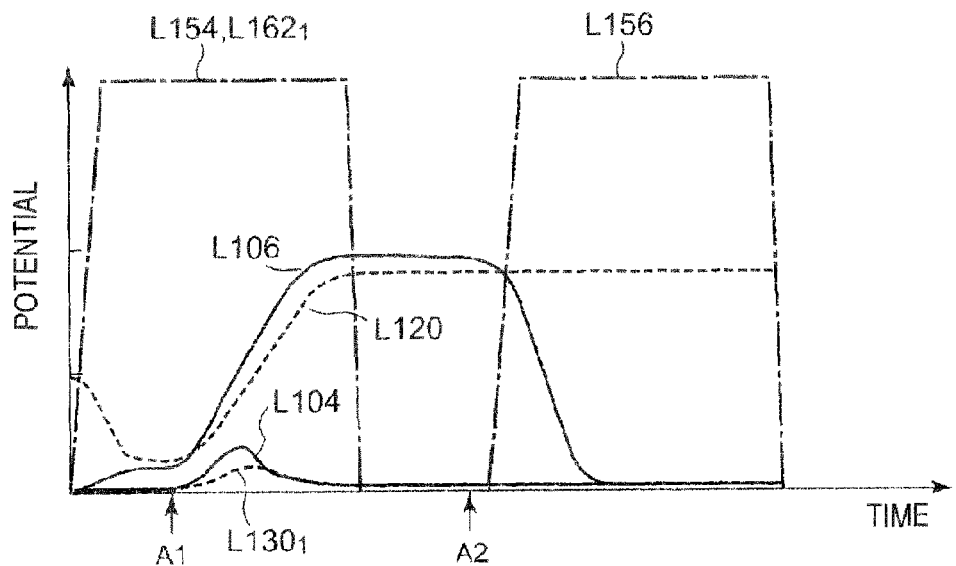

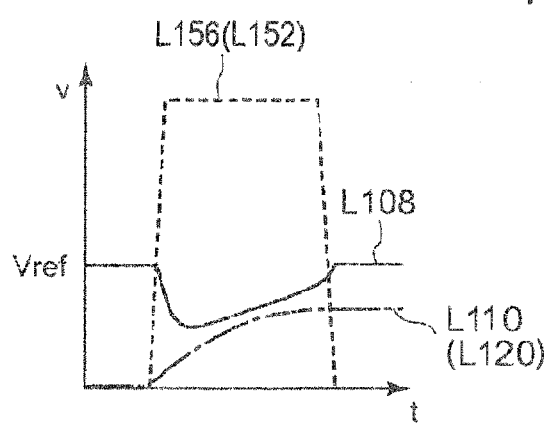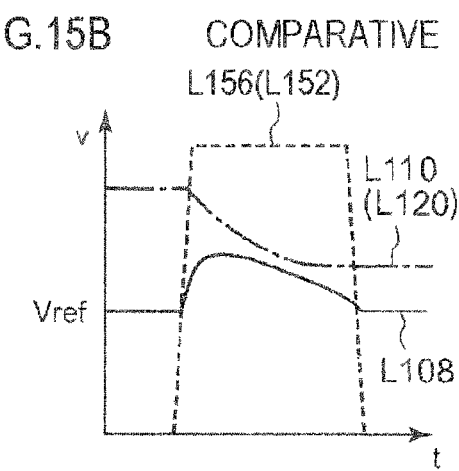

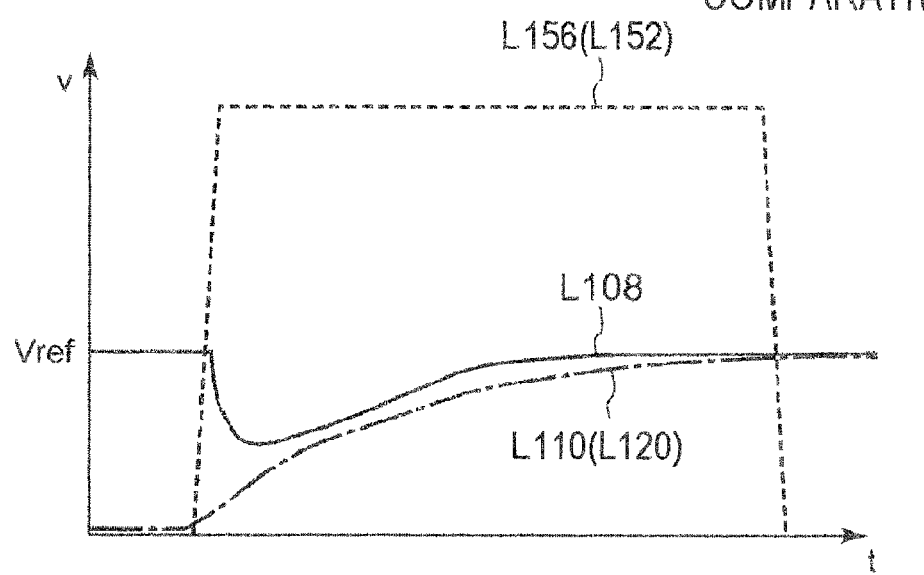

SEMICONDUCTOR MEMORY DEVICE

RELATED APPLICATION

The present application is claiming the benefit of the priority based on the Japanese Patent Application No. 2008-090160 filed on Mar. 31, 2008, and the entire disclosure thereof is incorporated herein by reference thereto.

FIELD OF THE INVENTION

The present invention relates to a semiconductor memory device, and particularly to a semiconductor memory device capable of high speed operation.

BACKGROUND

FIG. 12 is a circuit diagram showing a conventional semiconductor memory device (for instance Patent Document 1). In the semiconductor memory device 100, bit lines 104 and 106 are connected to a sense amplifier 102. To the bit lines 104 and 106, reference cells 110 and 120 are connected respectively. The reference cells 110 and 120 are connected to a common potential line 108. As described later, a reference potential is written to the reference cells 110 and 120 via this potential line 108.

The reference cell 110 is constituted by a capacitor 112 and transistors 114 and 116. Similarly, the reference cell 120 is constituted by a capacitor 122 and transistors 124 and 126. Word lines 152, 154, 156, and 158 are connected to gates of the transistors 124, 126, 114, and 116 respectively.

Memory cells $130_1$ to $130n$ are connected to the bit line 104. "n" is an integer equal to or greater than 2, for instance 128 or 256. Further, memory cells $140_1$ to $140n$ are connected to the bit line 106. Each of the memory cells $130_1$ to $130n$ is constituted by a capacitor 132 and a transistor 134. Word lines $162_1$ to $162n$ are respectively connected to gates of the transistors 134 of the memory cells $130_1$ to $130n$. Similarly, each of the memory cells $140_1$ to $140n$ is constituted by a capacitor 142 and a transistor 144. Word lines $164_1$ to $164n$ are respectively connected to gates of the transistors 144 of the memory cells $140_1$ to $140n$.

The read operation of the semiconductor memory device 100 will be described with reference to a timing chart in FIG. 13. In FIG. 13, the potentials of the word lines 152, 154, 156, 158, $162_1$, and $164_1$ are denoted by lines L152, L154, L156, L158, L$162_1$, and L$164_1$ respectively. Here, a case where data is read from the memory cells $130_1$ and $140_1$ consecutively will be explained.

First, by activating the word line 152 thereby turning on the transistor 124, the reference potential is written to the reference cell 120 via the potential line 108. The reference potential could be, for instance, ½ Vcc (a half of a power supply voltage). Here, "writing the reference potential to the reference cell" means that one end of the capacitor within the reference ell is made conductive with the potential line by turning on the transistor connected to the potential line out of the transistors constituting the reference cell. Next, after the word line 152 is deactivated thereby turning off the transistor 124, the word lines 154 and $162_1$ are activated. Then the transistors 126 and 134 are turned on, the potentials of the memory cell $130_1$ and the reference cell 120 are compared by the sense amplifier 102, and as a result, data is read from the memory cell $130_1$.

Next, by activating the word line 156 thereby turning on the transistor 114, the reference potential is written to the reference cell 110 via the potential line 108. Then, after the word line 156 is deactivated thereby turning off the transistor 114, the word lines 158 and $164_1$ are activated As a result, the transistors 116 and 144 are turned on, and data is read from the memory cell $140_1$.

FIGS. 14A and 14B are graphs showing how the potentials of the bit lines 104 and 106, the reference cell 120, and the memory cell $130_1$ change during data read-out. FIGS. 14A and 14B correspond to cases where the potential read out from the memory cell $130_1$ is HIGH and LOW respectively. In these graphs, the ordinate and abscissa represent potential V and time t, respectively. Lines L104, L106, L120, and L$130_1$ respectively denote the potentials of the bit lines 104 and 106, the reference cell 120, and the memory cell $130_1$. Further, arrow A1 indicates a point in time when the sense amplifier 102 is activated and arrow A2 indicates a point in time when the equalization of the bit lines 104 and 106 starts.

As shown in FIG. 14A, in the case where the potential read out from the memory cell $130_1$ is HIGH, the potentials of the bit lines 104 and 106 get closer to the HIGH and LOW levels respectively when the sense amplifier 102 is activated. At the same time, the potential of the reference cell 120 gets closer to the LOW level. On the other hand, as shown in FIG. 14B, in the case where the potential read out from the memory cell $130_1$ is LOW, the potentials of the bit lines 104 and 106 get closer to the LOW and HIGH levels respectively when the sense amplifier 102 is activated. At the same time, the potential of the reference cell 120 gets closer to the HIGH level.

Other than Patent Document 1, prior art documents related to the present invention are as follows: Patent Document 2, Patent Document 3, and Patent Document 4.
[Patent Document 1]
Japanese Patent Kokai Publication No. JP-P2006-278778A
[Patent Document 2]
Japanese Patent Kokai Publication No. JP-A-6-12860
[Patent Document 3]
Japanese Patent Kokai Publication No. JP-P2005-228446A
[Patent Document 4]
Japanese Patent Kokai Publication No JP-P2001-68636A

SUMMARY OF THE DISCLOSURE

The entire disclosures of the above mentioned patent documents are incorporated herein by reference thereto The following analysis is given by the present invention.

As described above, when the potential read out from the memory cell $130_1$ is HIGH, the potential of reference cell 120 becomes LOW at the completion of the read-out and when the potential read out from the memory cell $130_1$ is LOW, the potential of reference cell 120 becomes HIGH at the completion of the read-out.

In the semiconductor memory device 100 shown in FIG. 12, a large number (for instance several thousands) of the reference cells 110 are connected to one potential line 108. The reference potential is written to all the reference cells 110 simultaneously via the potential line 108. More concretely, when the potential of the reference cells 110 is LOW, the potential line 108 supplies electric charges to the reference cells 110, and when the potential of the reference cells 110 is HIGH, the reference cells 110 discharge electric charges to the potential line 108.

Therefore, after the read-out operation shown in FIGS. 14A and 14B, when data is subsequently read from the memory cell $130_1$, the following problem occurs. For instance, when the potentials of a majority of the reference cells 120 are LOW, the potential of the potential line 108 temporarily becomes lower than the reference potential Vref as indicated by the line L120 in FIG. 15A. Conversely, when the potentials of a majority of the reference cells 120 are HIGH, the potential of the potential line 108 temporarily becomes higher than the reference potential Vref as indicated by a line L108 in FIG. 15B. Note that the ordinate and abscissa represent respectively represent potential V and time t in FIGS. 15A and 15B.

This temporary fluctuations of the potential of the potential line 108 do not become an issue in a low-speed operation device such as a general purpose DRAM. For instance when the potentials of a majority of the reference cells 110 are LOW, as shown in FIG. 16, since the time period during which the word line 156 is activated is long, the potential of the capacitor 112 (indicated by a line L110) can be increased to the reference potential Vref during this time period Similarly, when the potentials of a majority of the reference cells 110 are HIGH, the potential of the capacitor 112 can be decreased to the reference potential Vref during the activation period of the word line 156.

However, in the case of a high-speed operation device such as a logic-embedded semiconductor memory device in which a logic circuit unit and a memory circuit unit are mounted on a single substrate, since the time period during which the word line 156 is activated is short, the word line 156 is deactivated before the potential of the capacitor 112 reaches the predetermined reference potential Vref, as shown in FIGS. 15A and 15B. As a result, data is read from each of the memory cells $140_1$ to $140n$ while there is a gap between the potential of the reference cell 110 and the reference potential Vref. This causes an error in data read-out.

For instance, when data is read from the memory cells $140_1$ to $140n$, whose potential is LOW, in a state in which the potential of the reference cell 110 is lower than the reference potential Vref, the differential amplification by the sense amplifier 102 might not be performed properly since the potential difference between the both cells is small. When data is read from the memory cells $140_1$ to $140n$, whose potential is HIGH, in a state in which the potential of the reference cell 110 is higher than the reference potential Vref, a similar problem might occur.

The reference cell 110 has been cited in the above description. It should be noted that similar problems occur in the case of the reference cell 120 (as shown by a line L120) as well.

A data read method described in Patent Document 2 is one of conventional technologies that try to solve these problems. In Patent Document 2, transistors of the reference cell connected to a bit line are deactivated before the sense amplifier is activated. This is supposed to prevent the potential of the reference cell from following potential fluctuations of the bit line at the time of the differential amplification by the sense amplifier.

However, in this method, it takes a certain amount of time from when the transistors of the reference cell are turned on and the reference potential is written to when the transistors are turned off. As a result, it becomes difficult to reduce the time period between the rising of the word line and the activation of the sense amplifier. This causes a problem that the operation speed is slowed down, for instance, in DRAM (particularly logic-embedded DRAM) requiring high-speed random access. Therefore, the method disclosed in Patent Document 2 cannot be applied to a semiconductor memory device in which high-speed operation is required.

Further, the method disclosed in Patent Document 2 has a problem that the capacitance balance is broken down between two bit lines connected to the sense amplifier at the time of the differential amplification by the sense amplifier. This is because one of the bit lines has a capacitor connected, whereas the other bit line does not. This causes an error in data read-out. Therefore, the method disclosed in Patent Document 2 is flawed in terms of data read reliability.

The present invention has been created in view of solving the above problems and it is an object of the present invention to provide a semiconductor memory device capable of suppressing the potential fluctuations of the potential line that provides potential to the reference cell even during high-speed read operation while maintaining high data read reliability.

According to a first aspect there is provided a semiconductor memory device that reads data by comparing a potential of a memory cell with a reference potential of a reference cell. The semiconductor memory device comprises: first and second bit lines connected to a same sense amplifier; a first memory cell connected to the first bit line; a second memory cell connected to the second bit line; a first reference cell connected to the first bit line; a second reference cell connected to the second bit line; and a potential line that supplies the reference potential to the first and second reference cells. The semiconductor memory device further comprises a dummy cell provided in addition to the first and second reference cells; having a coupling capacitor whose one end is electrically connected directly to the potential line.

According to a second aspect, there is provided a semiconductor memory device comprising:
a comparing unit that compares a potential of a memory cell with a reference potential supplied by a reference cell to read data of the memory cell;
first and second bit lines connected to inputs of the comparing unit;
a first memory cell connected to the first bit line;
a second memory cell connected to the second bit line;
a first reference cell acting as the reference dell;
a second reference cell acting as another reference cell; and
a potential line that supplies the reference potential to the first and second reference cells. The semiconductor memory device further comprises a dummy cell comprising a coupling capacitor that stabilizes potential of the potential line.

According to a third aspect, there is provided a process for reading data of a memory cell comprising:
providing a semiconductor memory device comprising:
first and second bit lines connected to a comparing unit;
a first memory cell connected to the first bit line;
a second memory cell connected to the second bit line;
a first reference cell connected to the first bit line;
a second reference cell connected to the second bit line; and
a potential line that supplies the reference potential to the first and second reference cells. The semiconductor memory device further comprises a dummy cell comprising a coupling capacitor; and potential of a memory cell is compared with a reference potential of a reference cell, wherein a potential of the coupling capacitor is directly supplied to the reference potential.

Meritorious effects or advantages available are mentioned below, however, without limitative nature.

According to the present invention, a semiconductor memory device, having high data read reliability capable of suppressing the potential fluctuations of a potential line even during high-speed operation can be realized.

BRIEF DESCRIPTIONS OF THE DRAWINGS

FIG. 2 is a timing chart for explaining the data read operation of the semiconductor memory device shown in FIG. 1.

FIGS. 3A and 3B are graphs showing how the potentials of bit lines and others in the semiconductor memory device in FIG. 1 change during data read operation.

FIG. 13 is a timing chart for explaining the data read operation of the semiconductor memory device shown in FIG. 12.

FIGS. 14A and 14B are graphs showing how the potentials of bit lines and others change in the semiconductor memory device shown in FIG. 12 during data read operation.

FIGS. 15A and 15B are graphs for explaining problems of the semiconductor memory device shown in FIG. 12.

FIG. 16 is a graph for explaining the problems of the semiconductor memory device shown in FIG. 12.

PREFERRED MODES

Preferred modes will be described in detail with reference to the drawings. Note that, when an element appears in more than one drawing, it will be given the same symbol and the description of it will not be repeated Exemplary Embodiment 1

Figure 1:
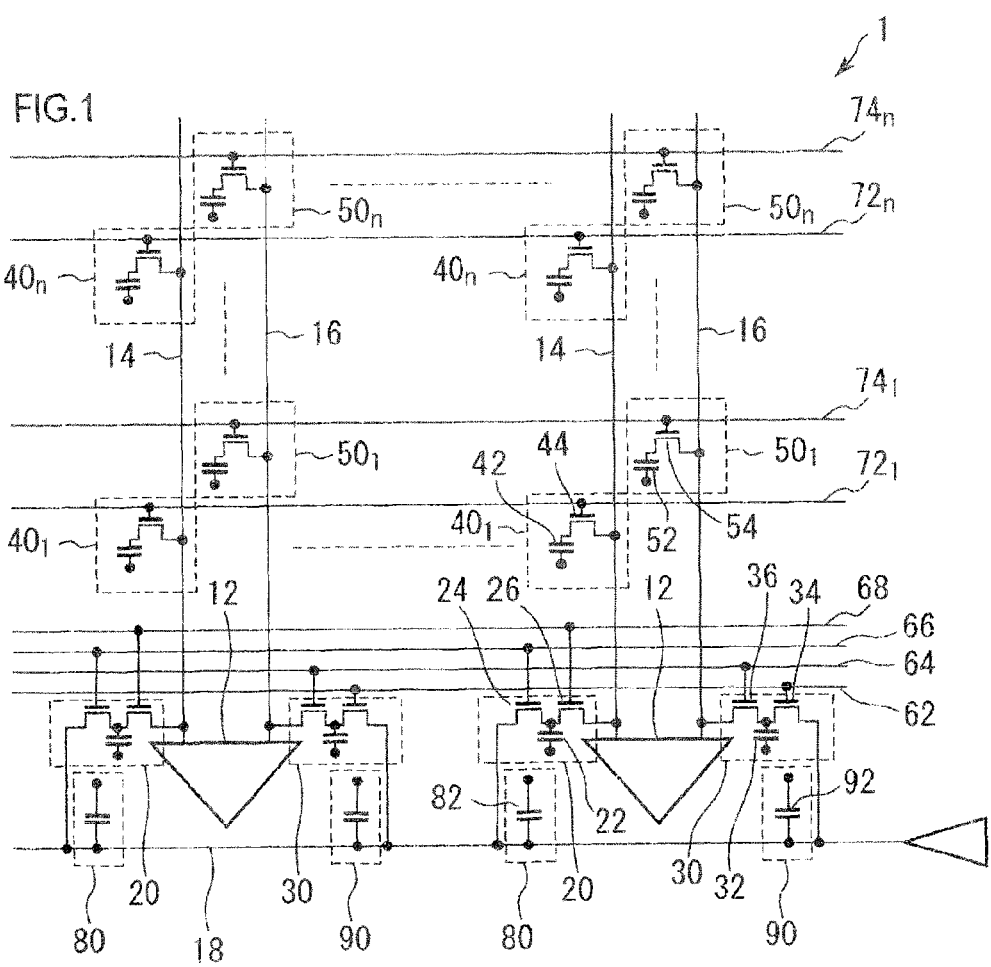
FIG. 1 is a circuit diagram showing a first exemplary embodiment of a semiconductor memory device.

FIG. 1 is a circuit diagram showing a first exemplary embodiment of a semiconductor memory device according to the present invention A DRAM 1 is a semiconductor memory device that reads data by comparing the potential of a memory cell with the reference potential of a reference cell, and comprises a bit line 14 (a first bit line) and a bit line 16 (a second bit line) connected to a common sense amplifier 12. The DRAM 1 further comprises a capacitor 22 (a first capacitor), a capacitor 32 (a second capacitor), and coupling capacitors 82 and 92.

The capacitors 22 and 32 are provided in a reference cell 20 (a first reference cell) and a reference cell 30 (a second reference cell) respectively. Meanwhile, the coupling capacitors 82 and 92 are provided in dummy cells 80 and 90 respectively. In the present disclosure, the "dummy cell" is a cell that is neither a memory cell nor a reference cell. It is preferred that the dummy cells 80 and 90 be disposed on an outer peripheral part of a cell array that includes the memory cells and reference cells for the reason explained later.

The reference cells 20 and 30 are connected to the bit lines 14 and 16 respectively. On the other hand, the dummy cells 80 and 90 are not connected to either the bit line 14 or the bit line 16. The reference cells 20 and 30 and the dummy cells 80 and 90 are connected to a common potential line 18. The reference potential is written to the reference cells 20 and 30 and the dummy cells 80 and 90 via the potential line 18, as described later.

The reference cell 20 is formed by the capacitor 22, a transistor 24 (a first transistor), and a transistor 26. The transistor 24 has its source or drain connected to the potential line 18 and the other connected to one end of the capacitor 22. The other end of the capacitor 22 is connected to a fixed potential. The fixed potential could be, for instance, ½ Vcc (a half of a power supply voltage). The transistor 26 has its source or drain connected to the bit line 14 and the other connected to an end of the capacitor 22, to which the source or drain of the transistor 24 is also connected. Word lines 66 and 68 are connected to gates of the transistors 24 and 26, respectively.

The reference cell 30 is formed by the capacitor 32, a transistor 34 (a second transistor), and a transistor 36. The transistor 34 has its source or drain connected to the potential line 18 and the other connected to one end of the capacitor 32. The other end of the capacitor 32 is connected to a fixed potential. The fixed potential could be, for instance, ½ Vcc. The transistor 36 has its source or drain connected to the bit line 16 and the other connected to an end of the capacitor 32, to which the source or drain of the transistor 34 is also connected. Word tines 62 and 64 are connected to gates of the transistors 34 and 36, respectively.

The coupling capacitor 82 is included in the dummy cell 80. It is not necessary to restrict the capacitance of the coupling capacitor 82, but preferably it should be set to the same value as the capacitance of the capacitors provided in the memory cells and the reference cells from the standpoint of device design and manufacturing. One end of the coupling capacitor 82 is electrically connected directly to the potential line 18. Further, the other end of the coupling capacitor 82 is connected to a fixed potential The fixed potential may be, for instance, ½ Vcc. Here, "electrically connected directly" means that they are electrically connected without any switching means such as a transistor interposed. However, the wiring (or conductor pattern), plugs and things electrically connected via diffusion layers may be included on the layout.

The dummy cell 90 includes the coupling capacitor 92 as the dummy cell 80 does the coupling capacitor 82. It is not necessary to restrict the capacitance of the coupling capacitor 92, but preferably it should be set to the same value as the capacitance of the capacitors of the memory cells and the capacitors 22 and 32 provided in the reference cells from the standpoint of device design and manufacturing. One end of the coupling capacitor 92 is electrically connected directly to the potential line 18. Further, the other end of the coupling capacitor 92 is connected to a fixed potential. The fixed potential may be, for instance, ½ Vcc.

Memory cells $40_1$ to $40n$ are connected to the bit line 14. "n" is an integer equal to or greater than 2, for instance 128 or 256. Each of the memory cells $40_1$ to $40n$ is constituted by a capacitor 42 (a third capacitor) and a transistor 44 (a third transistor). The transistor 44 has its source or drain connected to the bit line 14 and the other connected to one end of the capacitor 42. The other end of the capacitor 42 is connected to a fixed potential for Instance ½ Vcc potential. Word lines $72_1$ to $72n$ are connected to gates of the transistors 44 of the memory cells $40_1$ to $40n$, respectively.

Memory cells $50_1$ to $50n$ are connected to the bit line 16. Each of the memory cells $50_1$ to $50n$ is constituted by a capacitor 52 (a fourth capacitor) and a transistor 54 (a fourth transistor). The transistor 54 has its source or drain connected to the bit line 16 and the other connected to one end of the capacitor 52. The other end of the capacitor 52 is connected to a fixed potential, for instance, ½Vcc potential. Word lines 74₁ to 74n are connected to gates of the transistors 54 of the memory cells 50₁ to 50n, respectively.

As an example of a data read method according to the present invention, the data read operation of the DRAM 1 will be described with reference to a timing chart shown in FIG. 2. In FIG. 2, lines L62, L64, L66, L68, L72₁, and L74₁ respectively represent the potentials of the word lines 62, 64, 66, 68, 72₁, and 74₁. Here, a case where data is read from the memory cells 40₁ and 50₁ consecutively will be explained.

First, by activating the word line 62 thereby turning on the transistor 34, the reference potential is written to the capacitor 32 of the reference cell 30 via the potential line 18. The reference potential may be, for instance, ½ Vcc (a half of the power supply voltage). Next, after the word line 62 is deactivated thereby turning off the transistor 34, the word lines 64 and 72₁ are activated. Then the transistors 36 and 44 are turned on, the potentials of the memory cell 40₁ and the reference cell 30 are compared by the sense amplifier 12, and as a result, data is read from the memory cell 40₁. Then, the transistors 36 and 44 are turned off by deactivating the word lines 64 and 72₁.

Next, by activating the word line 66 thereby turning on the transistor 24, the reference potential is written to the capacitor 22 of the reference cell 20 via the potential line 18. Then, after the word line 66 is deactivated thereby turning off the transistor 24, the word lines 68 and 74₁ are activated. As a result, the transistors 26 and 54 are turned on, and data is read from the memory cell 50₁. Then, the transistors 26 and 54 are turned off by deactivating the word lines 68 and 74₁.

Next, the effects of the present exemplary embodiment will be explained. In the present exemplary embodiment, the coupling capacitors 82 and 92 are electrically connected directly to the potential line 18. In reality, a large number (for instance several thousands) of coupling capacitors are connected to the potential line in a semiconductor memory device. Since the potential 18 as a whole has a very large coupling capacitance, the potential fluctuations of the potential 18 caused by charge/discharge of electric charges during the write operation to the capacitor in the reference cell are suppressed. In other words, the potential fluctuations of the potential line 18 can be kept to a minimum as shown in FIG. 3. As a result, the read operation from the memory cell becomes stable since the potential written to the reference cell is stable. This results in a wider operating margin of the DRAM 1. Therefore, the device can sufficiently follow high-speed operation.

Meanwhile, the potential line 18 has a parasitic capacitance between the line itself and adjacent wiring lines. For instance, Patent Document 3 discloses a structure in which wiring lines associated with a parasitic capacitance are connected to reference cells. Meanwhile, the coupling capacitance in the semiconductor memory device of the present invention is sufficiently larger than the aforementioned parasitic capacitance. As a result, the potential fluctuations of the potential line can be sufficiently suppressed in the semiconductor memory device of the present invention. The relationship between the coupling capacitance and the parasitic capacitance between the potential line and the adjacent wiring lines in the semiconductor memory device of the present invention will be quantitatively explained below.

Figure 4:
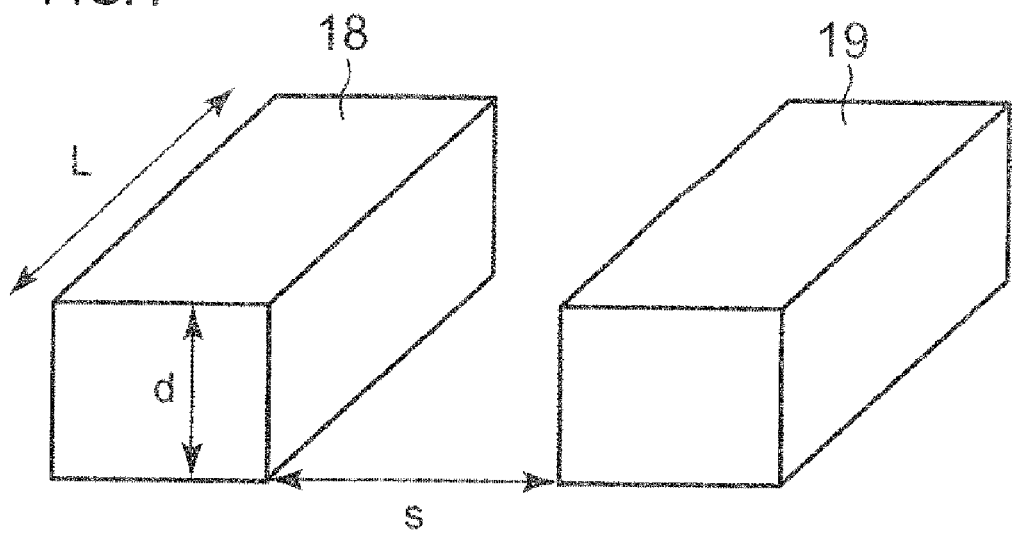
FIG. 4 is a drawing for explaining a parasitic capacitance between adjacent wiring lines.

FIG. 4 is a drawing for explaining how the parasitic capacitance between adjacent wiring lines is calculated. The parasitic capacitance occurring between the potential line 18 and an adjacent wiring line 19 is calculated using this drawing.

The line space and line height are, for instance in the case of the 65 nm generation: the minimum metallic line space s=0.10 μm; and the line height d=0.25 μm. The parasitic capacitance C between the wiring lines can be given by: $C = \in_0 \in_r \times d \times L/s$. $\in_0$ denotes the vacuum dielectric constant; $\in_r$ the relative dielectric constant of an insulating film used between wiring layers (here, assuming that SiO2 is used, $\in_r$=3.9). Assuming that the line length is 1.0 μm, the parasitic capacitance between the wiring lines can be estimated: C=0.22[fF/μm]. When more wiring lines are provided on both sides of the wiring line in question, the value increases to twice as much.

Meanwhile, with regard to the dummy cells, although this depends on the cell size, approximately 4 to 6 cells can be disposed within 1.0 μm in the case of the 65 nm generation. The coupling capacitance within the dummy cells is 8 to 20 [fF/cell], as the capacitance values of the capacitors of the memory cells and the reference cells.

Therefore, in the case of the 65 nm generation, by connecting the coupling capacitors provided in the dummy cells to the potential line, the coupling capacitance will increase by approximately 32 to 120 [fF/μm] according to calculation.

Since the coupling capacitance is by at least two digits (at least 100 times) larger than the parasitic capacitance between neighboring wiring lines, the coupling capacitors provided in the dummy cells have sufficient effects in suppressing the voltage fluctuations of the potential line. Further, in the above example, it is assumed that SiO2 is used as the insulating film between wiring lines, however, if low-k films having a small dielectric constant are used, the parasitic capacitance between neighboring wiring lines will be even smaller. Therefore the effects of the present invention will be even greater if the low-k films are used as insulating films between wiring lines.

As a result, even during high-speed operation, data read operation from the memory cells 50₁ to 50n in a state in which there is a gap between the potential of the reference cell 20 and a predetermined reference potential can be prevented. Similarly, data read operation from the memory cells 40₁ to 40n in a state in which there is a gap between the potential of the reference cell 30 and a predetermined reference potential can be prevented. As a result, the read operation from the memory cells becomes stable since the potential written to the reference cells is stable, further resulting in a wider operating margin of the DRAM 1. Therefore, the device can sufficiently follow high-speed read operation Exemplary Embodiment 2

Figure 5:
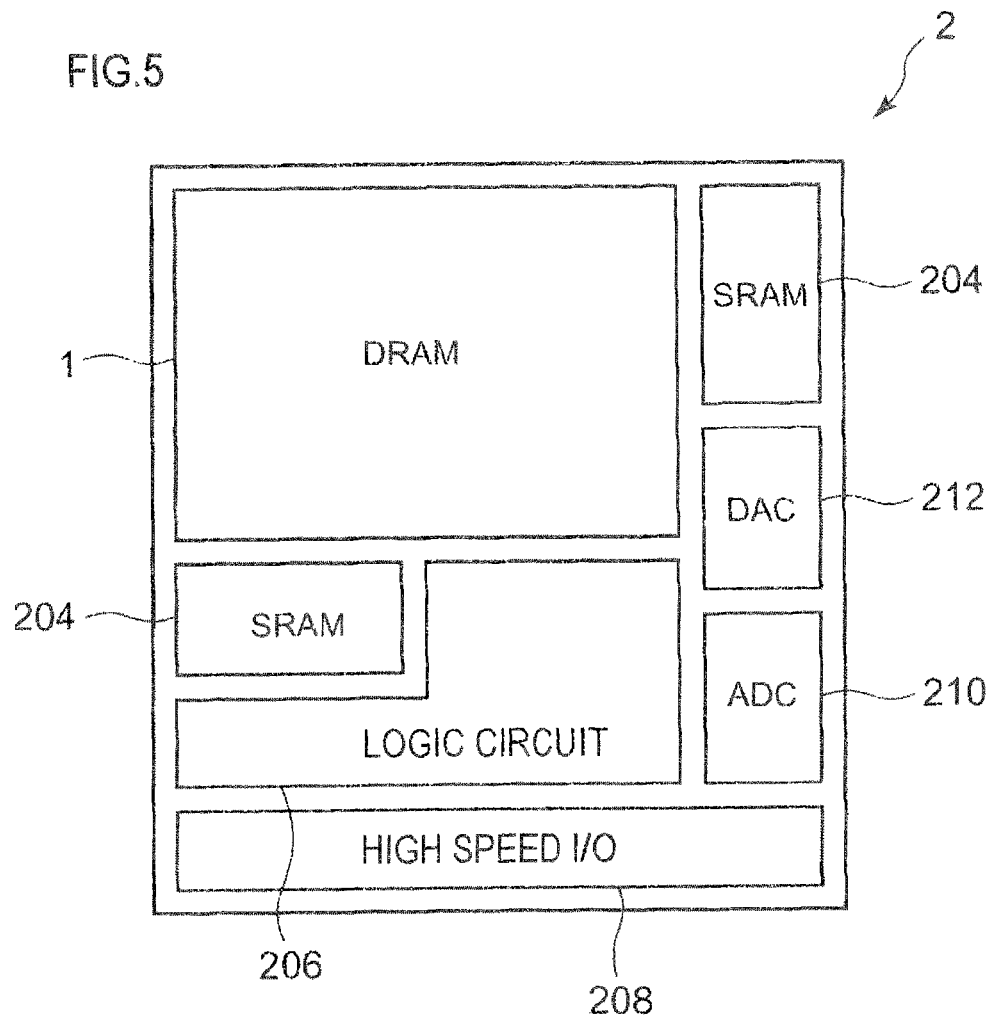
FIG. 5 is a drawing showing the circuit configuration of peripheral circuits in a second exemplary embodiment of the semiconductor memory device.

FIG. 5 is a drawing showing the circuit configuration of a semiconductor memory device in a second exemplary embodiment according to the present invention The second exemplary embodiment of the present invention is a logic embedded semiconductor memory device in which a logic circuit 206 and other peripheral circuits (a high-speed I/O circuit 208, an A/D converter 210, and a D/A converter 212) are provided on the same substrate on which the DRAM 1 in the first exemplary embodiment is provided.

Compared with conventional general-purpose semiconductor memory circuits, such a logic-embedded semiconductor memory device requires higher-speed operation. Since the present invention can realize a semiconductor memory device capable of securing stability of the potential of the potential line and having high data read reliability even during high-speed operation, the present invention is most effective for the logic-embedded semiconductor memory device in the present exemplary embodiment.

Example 1

Figure 6:
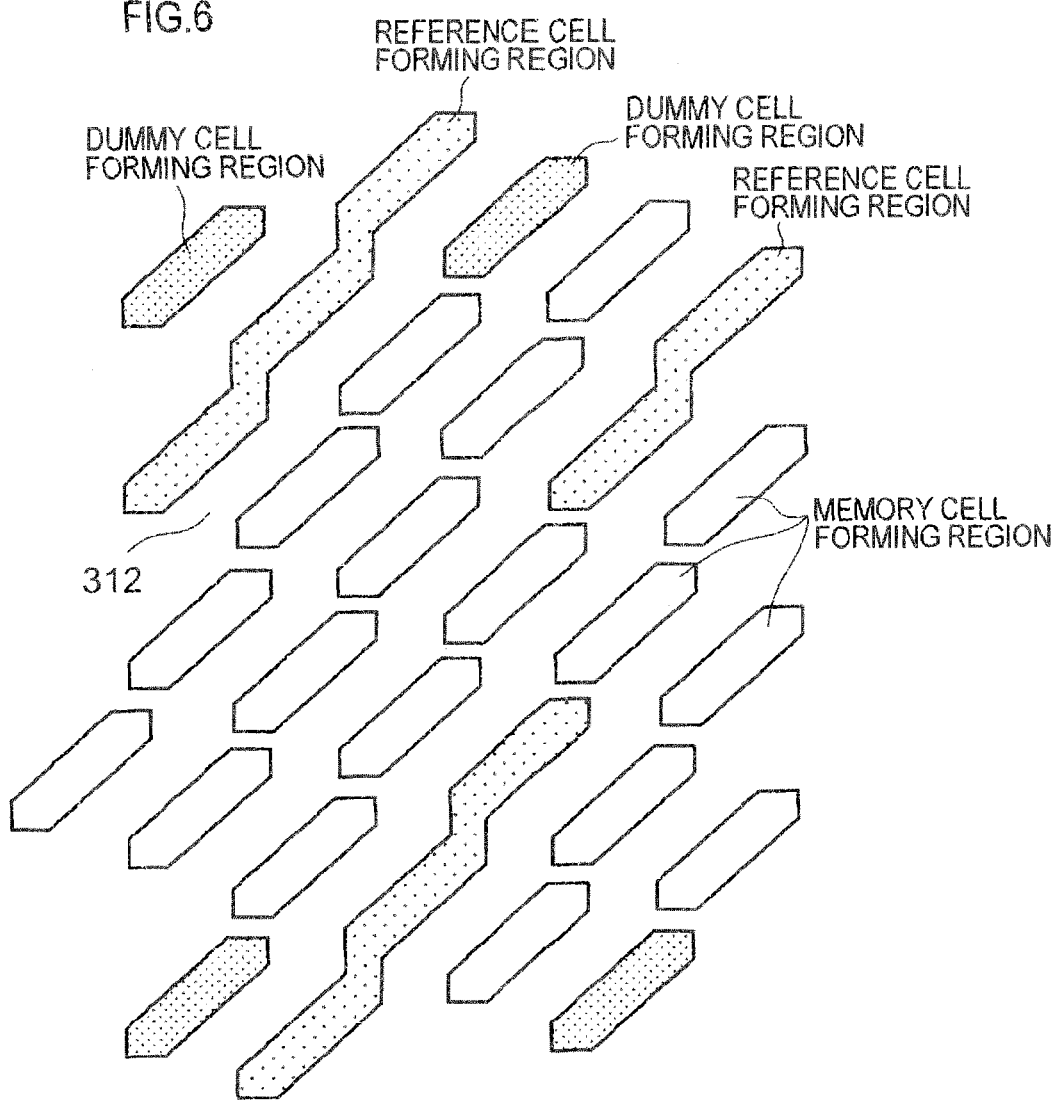
FIG. 6 is a plan view showing how each cell forming region is disposed in Example 1 of the semiconductor memory device.
Figure 7:
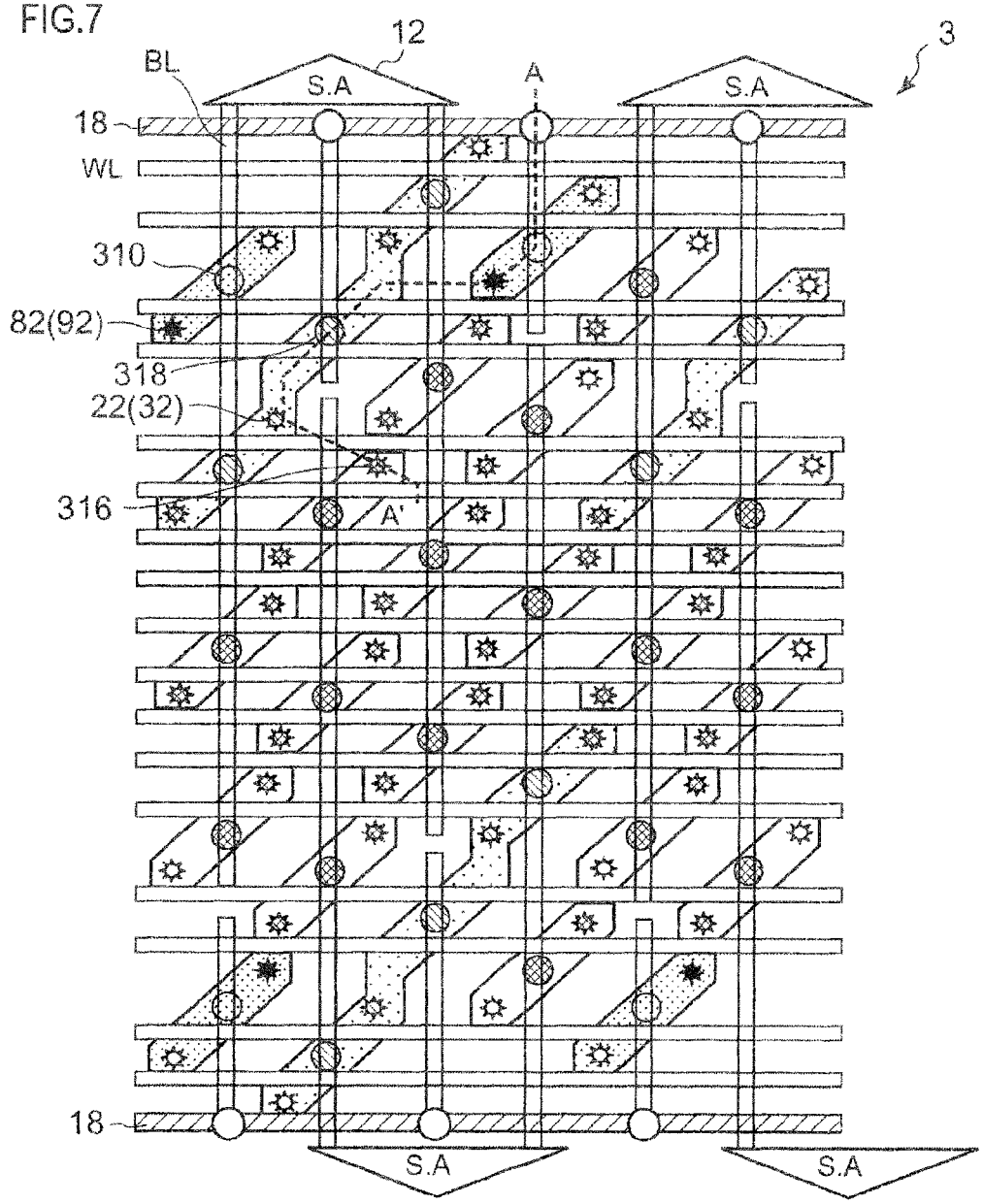
FIG. 7 is a plan view showing Example 1 of the semiconductor memory device.

The semiconductor memory device (DRAM) in the first exemplary embodiment is built. FIG. 6 is a plan view showing how each cell forming region is disposed in Example 1 of the semiconductor memory device according to the present invention. Further, FIG. 7 is a plan view showing Example 1 of the semiconductor memory device. The planar disposition of the cell forming regions shown in FIG. 6 is the same as in the conventional semiconductor memory devices.

As shown in FIG. 6, a memory cell forming region, a reference cell forming region, and a dummy cell forming region are disposed on a semiconductor substrate by intervention of an oxide silicon film 302 (see FIG. 8) for device isolation. Transistors are formed in each cell shown in FIG. 7. Further, after forming word lines WL, bit contacts 318, bit lines BL, capacitors for the memory cells, capacitors for the reference cells, and coupling capacitors, the semiconductor memory device 3 shown in FIG. 7 can be obtained.

Figure 8:
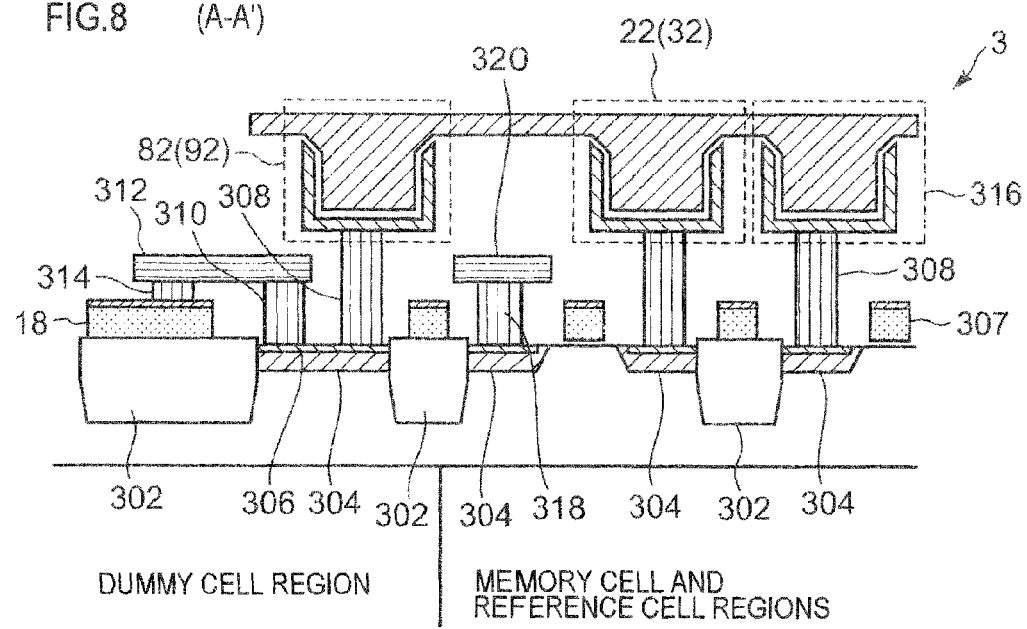
FIG. 8 is a cross-section view (taken along line A-A' in FIG. 7) of an end of a memory cell array of Example 1 of the semiconductor memory device.

FIG. 8 is a cross-section view taken along line A-A' in FIG. 7. Since the periodicity of cell arrangement is disrupted at ends of the cell array, the process accuracy of photolithography decreases thereat (for instance Patent Document 4). Because of this, the dummy cells, identically shaped as the memory cells and the reference cells, are normally disposed on the outer peripheral part of the cell array in the DRAM circuit, as shown in FIGS. 7 and 8. In the conventional semiconductor memory devices, the capacitors of these dummy cells are not electrically connected to transistors in other cells and are riot used.

As shown in FIG. 8, the oxide silicon film 302 for device isolation, a diffusion layer 304 functioning as the source or drain of transistors, a silicide layer 306, a gate insulating film (not shown in the drawing), and a gate electrode 307 are provided on the silicon substrate in the semiconductor memory device (DRAM 3). In the memory cell and reference cell regions, the capacitors of the memory cells and the reference cells are connected to the diffusion layer 304 by a capacitance contact plug 308 through the silicide layer 306. Further, a bit line 320 is connected to the diffusion layer 304 by a bit contact plug 318 interposed with the silicide layer 306.

In the dummy cell region, one end of the coupling capacitor 82 (or 92) is connected to the diffusion layer 304 by the capacitance contact plug 308 via the silicide layer 306. From the diffusion layer 304, the coupling capacitor is electrically connected directly to the potential line 18 via a contact plug 310, a wiring 312 formed on the same layer as the bit line, and a contact plug 314. As described, the semiconductor memory device in the first exemplary embodiment is realized by utilizing the capacitor in the dummy cell region, which is not used in the conventional semiconductor memory devices.

In the present example, the circuit configuration of the DRAM in the first exemplary embodiment is realized by directly and electrically connecting the capacitor formed in the dummy cell to the potential line. Since the capacitor 82 (or 92) in the dummy cell region in FIG. 8 simply functions as a coupling capacitor of the potential line 18, high process accuracy is not required for it, unlike the capacitors of the memory cells and the reference cells. In other words, the process accuracy in the cell region on the outer peripheral part of the cell array should be sufficient for the coupling capacitor to function. Therefore the structure of the present example can be realized within the same area as those of the conventional semiconductor memory devices.

Example 2

Figure 9:
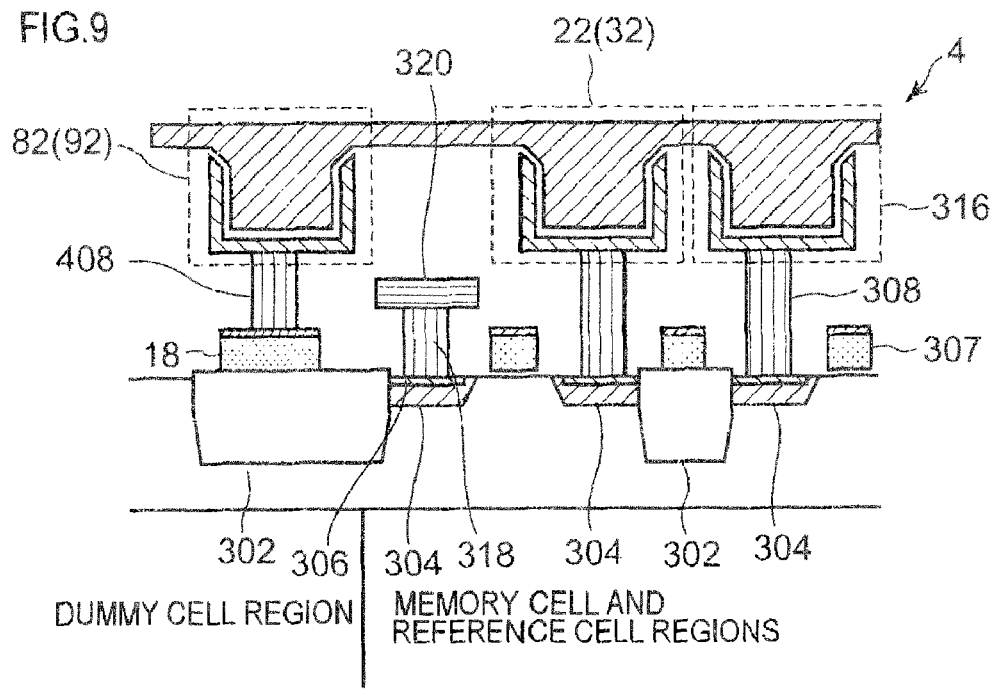
FIG. 9 is a cross-section view of an end of a memory cell array of Example 2 of the semiconductor memory device.

FIG. 9 is a cross-section view of an end of a cell array of Example 2: a semiconductor memory device (DRAM 4). The potential line 18 is disposed immediately below the dummy capacitor 82 (or 92) and they are electrically connected directly to each other by a capacitance contact plug 408.

In the present example, the area of the entire DRAM circuit including the potential line can be smaller than that of Example 1. Further, it has an advantage of eliminating the parasitic capacitance since the coupling capacitor 82 (or 92) is connected to the potential line 18 without going through (intervention of) the diffusion layer.

Example 3

Figure 10:
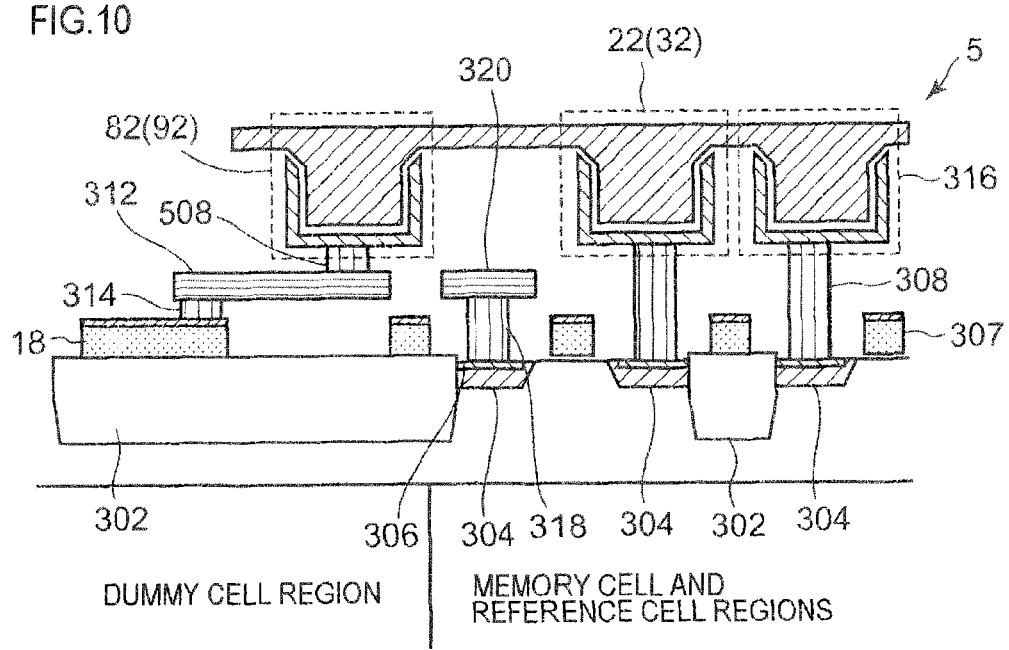
FIG. 10 is a cross-section view of an end of a memory cell array of Example 3 of the semiconductor memory device.

FIG. 10 is a cross-section view of an end of a cell array of Example 3: a semiconductor memory device (DRAM 5). In Example 1, the coupling capacitor 82 (or 92) and the potential line 18 are electrically connected directly to each other via the diffusion layer 304, as shown in FIG. 5. Meanwhile, in the present example, the coupling capacitor 82 (or 92) and the potential line 18 are electrically connected directly to each other by a capacitance plug 508, a wiring 312 formed on the same layer as the bit line, and a via plug 314 without going through (intervention of) the diffusion layer as shown in FIG. 10.

In the present example, the parasitic capacitance can be made smaller since the diffusion layer is not interposed between the coupling capacitor 82 (or 92) and the potential line 18. Further, the layout change required in Example 2 is not necessary.

Comparative Example

Figure 17:
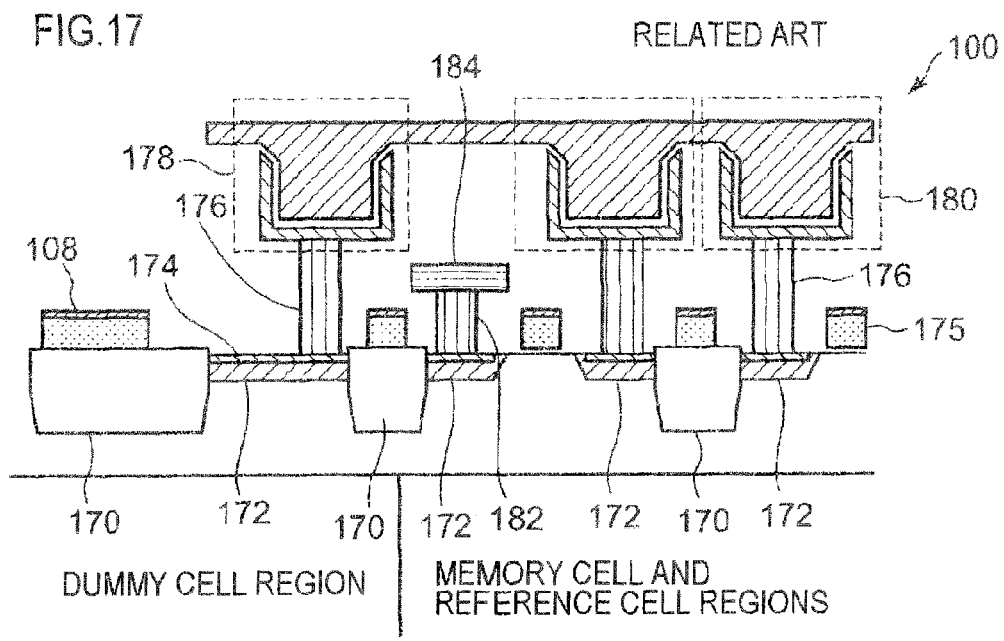
FIG. 17 is a cross-section view of an end of an example of a memory cell array of the conventional semiconductor memory device, for comparative explanation.

As a comparative example, the conventional semiconductor memory device (DRAM 100) is built. FIG. 17 is a cross-section view of an end of a cell array of the conventional semiconductor memory device (DRAM 100). The planar disposition of each cell is the same as in Example 1 of the present invention, shown in FIG. 6. An silicon oxide film 170 for device isolation, a diffusion layer 172 functioning as the source or drain of transistors, a silicide layer 174, a gate insulating film (not shown in the drawing), and a gate electrode 175 are provided on a silicon substrate. In memory cell and reference cell regions, the capacitors of the memory cells and the reference cells are connected to the diffusion layer 172 by a capacitance contact plug 176 via the silicide layer 174. Further, the potential line 108 is not connected to the diffusion layer of the dummy cells.

Compared with the conventional semiconductor memory device, a more stable read operation is provided in the semiconductor memory devices built according to Examples 1, 2, and 3, even during high-speed operation.

Figure 11:
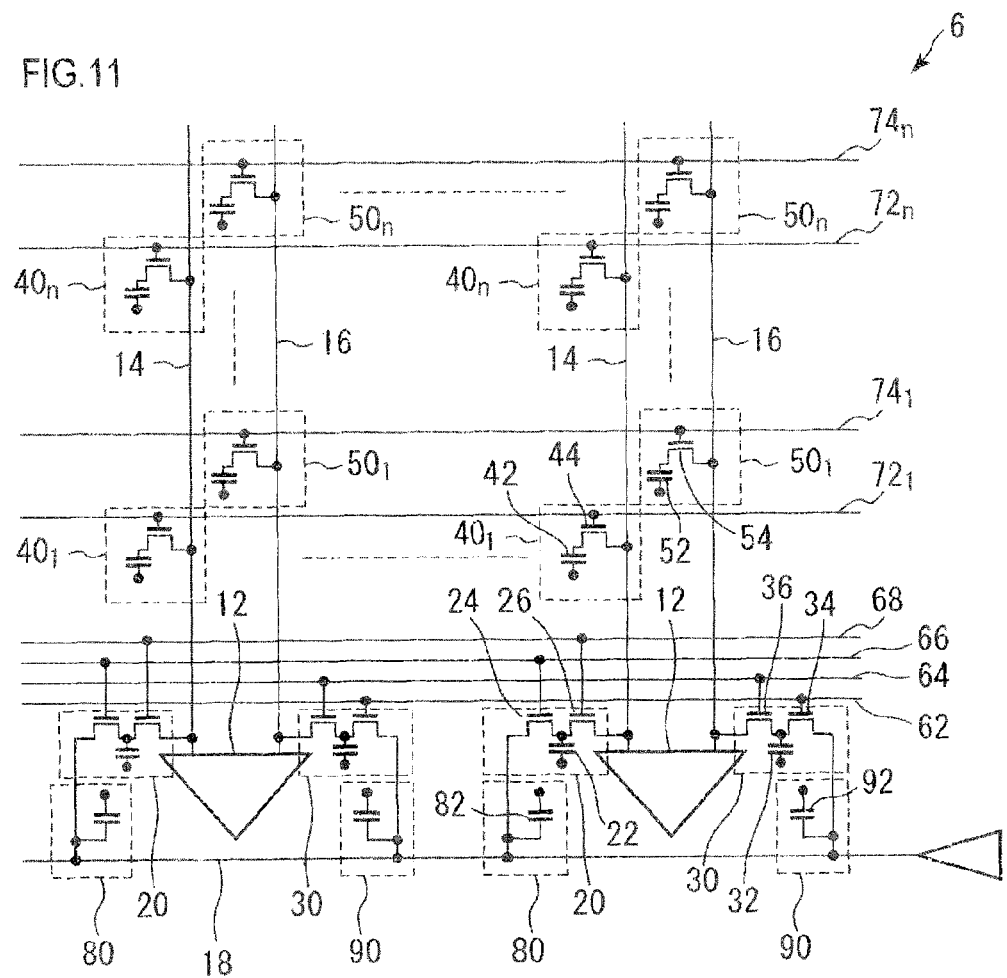
FIG. 11 is a drawing showing a variant of the semiconductor memory device in the first exemplary embodiment.
Figure 12:
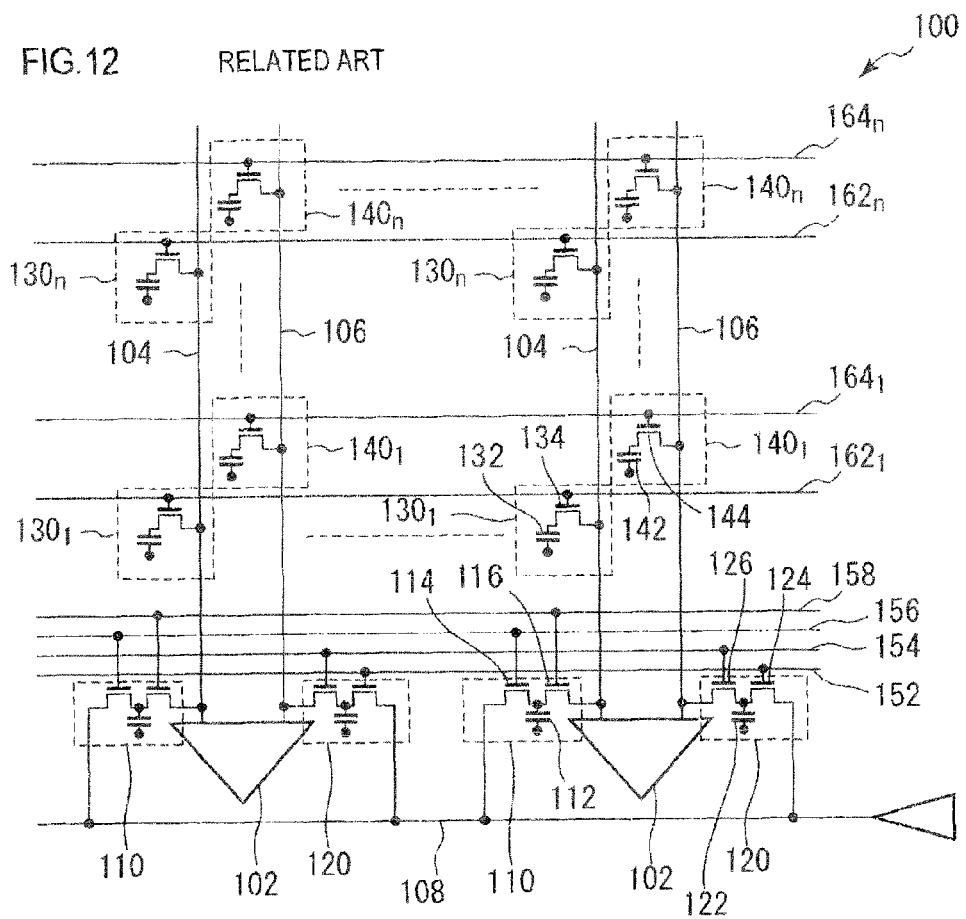
FIG. 12 is a circuit diagram showing an example of a conventional semiconductor memory device for a comparative explanation.

The present invention is not limited to the exemplary embodiments or examples described herein, and various modifications are possible. For instance, in the above exemplary embodiments, one end of the coupling capacitor of the semiconductor memory device 6 may be connected to a wiring line that supplies potential from the potential line to the reference cells, as shown in FIG. 11. In such a structure, the coupling capacitor is still electrically connected directly to the potential line, and the same effects as in the above modes can be obtained.

Further, the capacitors provided in all the dummy cells are electrically connected directly to the potential line 18 in the above exemplary embodiments, however, the capacitors provided in only some of the dummy cells may be electrically connected directly to the potential line 18.

Further, in the exemplary embodiments described herein, the present invention is applied to the logic-embedded DRAM. The present invention can also be applied to increasing the operation speed of any semiconductor memory device that reads data from the memory cell by comparing it with the reference cell. Such semiconductor memory devices include, other than the logic-embedded DRAM, DRAM requiring high-speed random access, FeRAM (Ferroelectric RAM), and MRAM (Magnetoresistive RAM) or else as far as the present invention can be applied effectively.

It should be noted in the second aspect, that there is a comparing unit that compares a potential of a memory cell with a reference potential supplied by a reference cell to read data of the memory cell, in place of a sense amplifier. Also, another dummy cell may be provided in association with the second reference cell.

In the third aspect of the process reading data of a memory cell, the comparison of potential may be carried out by comparing a potential of the second bit line with a reference potential of the first bit line supplied by the first reference cell which is stabilized by the dummy cell.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed S and/or claimed elements, matters and/or items may fall under the modifications aforementioned.

EXPLANATIONS OF SYMBOLS

1: DRAM
12: sense amplifier
14: bit line
16: bit line
18: potential line
20: reference cell
22: capacitor
24: transistor
26: transistor
30: reference cell
32: capacitor
34: transistor
36: transistor
401 to 40n: memory cell
42: capacitor
44: transistor
501 to 50n: memory cell
52: capacitor
54: transistor
62: word line
64: word line
66: word line
68: word line
69: word line
721 to 72n: word line
741 to 74n: word line
80: dummy cell
82: capacitor
84: transistor
90: dummy cell
92: capacitor
94: transistor
WL: word line
BL: bit line

What is claimed is:

1. A semiconductor memory device that reads data by comparing a potential of a memory cell with a reference potential of a reference cell comprising:
   first and second bit lines connected to a same sense amplifier;
   a first memory cell connected to said first bit line;
   a second memory cell connected to said second bit line;
   a first reference cell connected to said first bit line;
   a second reference cell connected to said second bit line;
   a potential line that supplies said reference potential to said first and second reference cells; and
   a dummy cell provided in addition to said first and second reference cells and said first and second memory cells;
   said dummy cell comprising a coupling capacitor whose one end is electrically connected directly to said potential line.

2. The semiconductor memory device as defined in claim 1, wherein said first reference cell includes a first capacitor and a first transistor having its source or drain connected to said potential line and the other connected to an end of said first capacitor and said second reference cell includes a second capacitor and a second transistor having its source or drain connected to said potential line and the other connected to an end of said second capacitor.

3. The semiconductor memory device as defined in claim 1, wherein said first memory cell includes a first memory capacitor and a third transistor having its source or drain connected to said first bit line and the other connected to an end of said third capacitor, and said second memory cell includes a second memory capacitor and a fourth transistor having its source or drain connected to said second bit line and the other connected to an end of said fourth capacitor.

4. The semiconductor memory device as defined in claim 1, wherein the other end of said coupling capacitor is connected to a fixed potential.

5. The semiconductor memory device as defined in claim 1 wherein the other ends of said first to fourth capacitors are connected to a fixed potential.

6. The semiconductor memory device as defined in claim 4, wherein said fixed potential is a half of a power supply voltage.

7. The semiconductor memory device as defined in claim 1, wherein said dummy cell is disposed on an outer peripheral part of a cell array that includes said memory cell and said reference cell.

8. The semiconductor memory device as defined in claim 1 further comprising a logic circuit on the same substrate as a logic-embedded semiconductor memory device.

* * * * *